(12) United States Patent
Endo et al.

(10) Patent No.: US 8,500,908 B2
(45) Date of Patent: *Aug. 6, 2013

(54) METHOD AND SYSTEM FOR MASK HANDLING IN HIGH PRODUCTIVITY CHAMBER

(71) Applicant: Intermolecular, Inc., San Jose, CA (US)

(72) Inventors: Rick Endo, San Carlos, CA (US); James Tsung, Milpitas, CA (US); Kurt H Weiner, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/656,118

(22) Filed: Oct. 19, 2012

(65) Prior Publication Data
US 2013/0042810 A1      Feb. 21, 2013

Related U.S. Application Data

(63) Continuation of application No. 13/169,257, filed on Jun. 27, 2011, now Pat. No. 8,317,925, which is a continuation of application No. 11/754,999, filed on May 30, 2007, now Pat. No. 7,993,461.

(51) Int. Cl.
*C23C 16/04* (2006.01)
(52) U.S. Cl.
USPC .......................................................... 118/720
(58) Field of Classification Search
USPC .......................................................... 118/720
See application file for complete search history.

(56) References Cited

U.S. PATENT DOCUMENTS

| | | | | |
|---|---|---|---|---|
| 7,883,579 B2 * | 2/2011 | Kodashima et al. | .......... | 118/715 |
| 7,993,461 B2 * | 8/2011 | Endo et al. | ..................... | 118/728 |
| 8,317,925 B2 * | 11/2012 | Endo et al. | ..................... | 118/728 |
| 2013/0042810 A1 * | 2/2013 | Endo et al. | ..................... | 118/720 |

* cited by examiner

*Primary Examiner* — Sylvia R MacArthur

(57) ABSTRACT

A structure for independently supporting a wafer and a mask in a processing chamber is provided. The structure includes a set of extensions for supporting the wafer and a set of extensions supporting the mask. The set of extensions for the wafer and the set of extensions for the mask enable independent movement of the wafer and the mask. In one embodiment, the extensions are affixed to an annular ring which is capable of moving in a vertical direction within the processing chamber. A processing chamber, a mask, and a method for combinatorially processing a substrate are also provided.

10 Claims, 21 Drawing Sheets

METHOD AND SYSTEM FOR MASK HANDLING IN HIGH PRODUCTIVITY CHAMBER

CROSS REFERENCE TO RELATED APPLICATIONS

This is a Continuation Application under 35 U.S.C. §120 of U.S. patent application Ser. No. 13/169,257, filed on Jun. 27, 2011, which is a Continuation Application under 35 U.S.C. §120 of U.S. patent application Ser. No. 11/754,999, filed May 30, 2007, each of which are herein incorporated by reference for all purposes.

BACKGROUND

The ability to process uniformly across a monolithic substrate and/or across a series of monolithic substrates is advantageous for manufacturing efficiency and cost effectiveness, as well as repeatability and control. However, uniform processing across an entire substrate can be disadvantageous when optimizing, qualifying or investigating new materials, new processes, and/or new process sequence integration schemes, since the entire substrate is nominally made the same using the same materials, processes and process sequence integration scheme. Each so processed substrate represents in essence only one possible variation per substrate. Thus, the full wafer uniform processing under conventional processing techniques results in fewer data points per substrate, longer times to accumulate a wide variety of data and higher costs associated with obtaining such data.

Combinatorial processing enables a more efficient evaluation of techniques that may eventually become integrated into a conventional processing scheme. When performing combinatorial processing it is desirable to perform as many tests in as short a time frame as is feasible. However, current combinatorial chambers come up against limitations in the amount of data that can be gathered from a single substrate, especially with respect to plasma processing chambers. Accordingly, there is a need to be able to more efficiently screen and analyze an array of materials, processes, and process sequence integration schemes across a substrate in order to more efficiently evaluate alternative materials, processes, and process sequence integration schemes for semiconductor manufacturing processes.

SUMMARY

Embodiments of the present invention provide a method and an apparatus for independent support of a substrate and a mask for combinatorial processing to enable efficient evaluation of alternative materials, processes, and process sequence integration schemes across a substrate. Several inventive embodiments of the present invention are described below.

In one aspect of the invention, a structure for independently supporting a wafer and a mask in a processing chamber is provided. The structure includes a set of extensions for supporting the wafer and a set of extensions supporting the mask. The set of extensions for the wafer and the set of extensions for the mask enable independent movement of the wafer and the mask. In one embodiment, the extensions are affixed to an annular ring which is capable of moving in a vertical direction within the processing chamber. In another embodiment, more than two sets of extensions are included. Each different set of extensions supports the substrate or mask at different levels within the chamber in yet another embodiment. The processing chamber may include a moveable substrate support and a clamp ring, in addition to the structure. The clamp ring has a bottom surface configured to orient the mask relative to the substrate.

In another aspect of the invention, a mask for utilization in processing a semiconductor substrate within a processing chamber is provided. The mask is embodied as a disk having an aperture defined therein. The disk has a plurality of tabs extending from a perimeter of the disk, and the plurality of tabs enable support of the disk independent from a substrate to be processed under the mask. In one embodiment, a surface of the disk includes a protrusion extending from the surface to enable the disk to be spaced apart from the substrate during the processing.

In yet another aspect of the invention, a method of processing a substrate in a processing chamber is provided. The method includes receiving a substrate and receiving a mask on a support structure, wherein the mask is moveable independent of the substrate. The method further includes moving the mask within the processing chamber using the support structure without breaking vacuum in the processing chamber. In one embodiment, the mask may be replaced with another mask without breaking vacuum. In another embodiment, the substrate is received on a different level of the support structure and lifted off of that level by a substrate support that is capable of rotating while the mask remains on the support structure.

Other aspects of the invention will become apparent from the following detailed description, taken in conjunction with the accompanying drawings, illustrating by way of example, the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

The embodiments described herein provide a method and apparatus for supporting a mask and a substrate independently within a semiconductor processing chamber. It will be obvious, however, to one skilled in the art, that the present invention may be practiced without some or all of these specific details. In other instances, well known process operations have not been described in detail in order not to unnecessarily obscure the present invention.

The embodiments described herein provide for a high productivity chamber where a clamp ring is used to center a mask and/or wafer to a pedestal, also referred to as a substrate support or chuck, and wherein a mask may be transferred into or out of the processing chamber or moved within the processing chamber independently from the wafer. In addition, movement of the mask may be performed without the need to break vacuum within the chamber. The embodiments further enable multiple masks, as well as the wafer, to be accommodated within the chamber and independently supported by a support structure within the chamber. Of course, a mask may be moved out of the chamber and a new mask may be moved into the chamber replacing the previous mask without breaking vacuum in another embodiment. In one embodiment, the outer diameter of the mask is designed to be the same diameter as the wafer. In another embodiment, the mask includes multiple ears or extensions emanating from an outer circumference of the mask, which are captured and held by cantilevered, dimpled, lift fingers. This design feature controls the azimuth location. Between the centering feature of the clamp ring and this azimuth control feature, precise mask opening placement is ensured. The mask design, as well as the lift structure will be accommodated by a standard high productivity robot blade, as well as a standard cassette for transfer and storage, respectively. Additional embodiments disclosed herein include spacers disposed on a surface of a mask that keep the substrate and the mask spaced apart, while minimizing mask to wafer contact areas.

Figure 1:
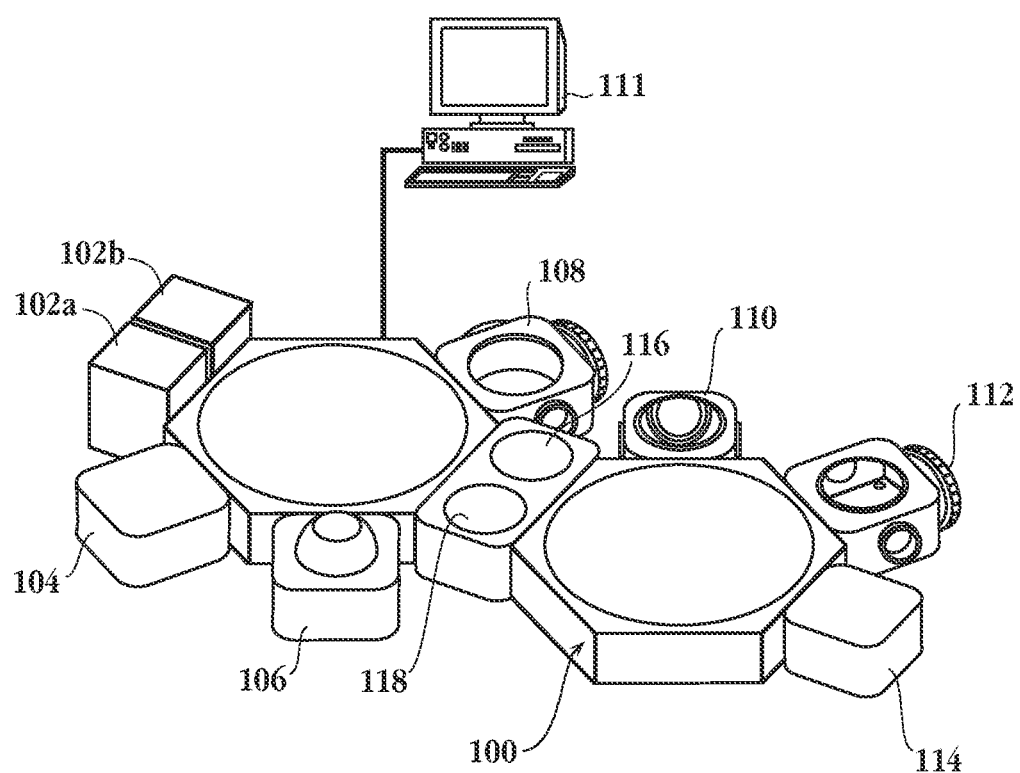
FIG. 1 is a simplified schematic diagram illustrating a perspective view of an integrated high productivity combinatorial (HPC) deposition system in accordance with one embodiment of the invention.

FIG. 1 is a simplified schematic diagram illustrating a perspective view of an integrated high productivity combinatorial (HPC) deposition system in accordance with one embodiment of the invention. HPC deposition system includes frame 100 supporting a plurality of processing modules. It should be appreciated that frame 100 may be a unitary frame in accordance with one embodiment. For example, frame 100 may be manufactured from a monolithic unitary aluminum block. However, any suitable structure configured to support the modules described herein and allow for the transportation of substrates between the plurality of modules may be used for the embodiments described herein. That is, frame 100 may be a plurality of separate pieces integrated together. Load locks/factory interfaces 102a and 102b provide access into the plurality of modules of the HPC deposition system. In accordance with one embodiment, load locks/factory interfaces 102a and 102b may include a front opening unitary pod (FOUP). It should be appreciated that within frame 100 a robot will provide for the movement of substrates and masks between the modules and for the movement into and out of load locks/factory interfaces 102a and 102b. Module 104 may be an orientation/degassing module in accordance with one embodiment. For example, module 104 may align a substrate by locating a notch in conveying the notch position to the robot, or controller of the robot, so that the substrate will be oriented correctly in the processing modules. In another embodiment module 104 may serve to degas substrates. For example, lamps may be used to remove moisture from the surface of substrates prior to entering processing chambers or leaving the modules.

Module 106 of FIG. 1, serves as a clean module in accordance with one embodiment of the invention. The cleaning performed by module 106 may be a plasma based or a non-plasma based process. In one embodiment, the cleaning can be vapor based process. It should be noted that the cleaning may be a dry process, but is not limited to dry cleaning processes, as wet cleaning processed used in semiconductor processing may be also incorporated here. Consequently, any of the known cleaning processes commonly used in semiconductor manufacturing operations may be performed in module 106. Module 114 may be referred to as a library module in accordance with one embodiment of the invention. In module 114 a plurality of masks, also referred to as processing masks, are stored. The masks may be used in the combinatorial processing modules in order to apply a certain pattern to a substrate being processed in those modules. Modules 110 and 112 are conventional deposition modules in accordance with one embodiment of the invention. Here, modules 110 and 112 may be configured to perform conventional physical vapor deposition, (PVD), chemical vapor deposition (CVD), atomic layer deposition (ALD), plasma enhanced atomic layer deposition (PEALD), rapid thermal processing (RTP), etc., processes in accordance with one embodiment of the invention. Of course, the conventional modules 110 and 112 may also be configured to perform ion-induced atomic layer deposition (II-ALD), or radical enhanced atomic layer deposition (RE-ALD). One skilled in the art will appreciate that the conventional processing modules can also include thermal, laser, ultraviolet, infrared, microwave, electron beam, ion, and other forms of treatment modules known in the art.

Module 108 of FIG. 1 is a HPC physical vapor deposition module in accordance with one embodiment of the invention. HPC module 108 is capable of executing techniques, methodologies, processes, test vehicles, synthetic procedures, technology, or combinations thereof used for the simultaneous, parallel, or rapid serial: (i) design, (ii) synthesis, (iii) processing, (iv) process sequencing, (v) process integration, (vi) device integration, (vii) analysis or (viii) characterization of more than two compounds, compositions, mixtures, processes, or synthesis conditions, or the structures derived from such. It should be appreciated that test vehicles include, but are not limited to, physical, electrical, photolytic, and/or magnetic characterization devices such as test structures on chips, used in the design, process development, manufacturing process qualification, and manufacturing process control with integrated circuit devices. Modules 116 and 118 function as pass through so that substrates may pass between the modules of block 100. In addition, modules 116 and 118 may provide orientation capability for substrates and/or masks being transferred between modules in accordance with one embodiment of the invention. In one embodiment, modules 116 and 118 may provide rotation of a mask to pattern different portions of a substrate. Through the embodiments described herein, a mask may be removed from a combinatorial processing chamber, rotated through modules 116 or 118, and placed back into the combinatorial processing chamber without breaking vacuum in the combinatorial processing chamber. As described in more detail below, the movement of the mask is independent of the substrate being processed.

In one embodiment, HPC module 108 is configured to perform physical vapor deposition. In other embodiments, the HPC module is configured to perform at least one of chemical vapor deposition (CVD), plasma enhanced chemical vapor deposition (PECVD), atomic layer deposition (ALD), plasma enhanced atomic layer deposition (PEALD), ion-induced atomic layer deposition (II-ALD), radical enhanced atomic layer deposition (RE-ALD), thermal treatment, laser treatment, ultraviolet treatment, infrared treatment, laser treatment, ultraviolet treatment, infrared treatment, microwave treatment, electron beam treatment, and ion treatment. It should be appreciated that while FIG. 1 illustrates a specific configuration of the modules, this configuration is not meant to be limiting. That is, any combination of modules may be incorporated in the HPC deposition system, as long as a HPC deposition module, such as module 108 is included. Thus, numerous configurations of the processing system of FIG. 1 are possible.

One skilled in the art will appreciate that a controller may control the operations and processes referred to herein. That is, a recipe for a certain process is programmed into the memory of a controller and the controller executes the recipe by manipulating valves, power supplies, robots, and other physical devices of the modules of the cluster tool to achieve the desired functionality. The controller may be part of the computing system having a graphical user interface for viewing the process, process results of an in-situ testing, as well as modifying the recipe. The computing device will include a central processing unit (CPU) a memory, a bus for communication between the memory and the CPU, as well as input/output capability and a display. In one embodiment, a centralized controller, i.e., computing device 111, may control the process of the HPC system. Alternatively, each module may have a controller in communication with centralized computing device 111. Of course, controllers may be local to some module while other modules may be controlled through centralized computing device 111. Further details on the configuration and operating parameters for HPC module 108 may be found in U.S. application Ser. No. 11/672,478.

Figure 2:
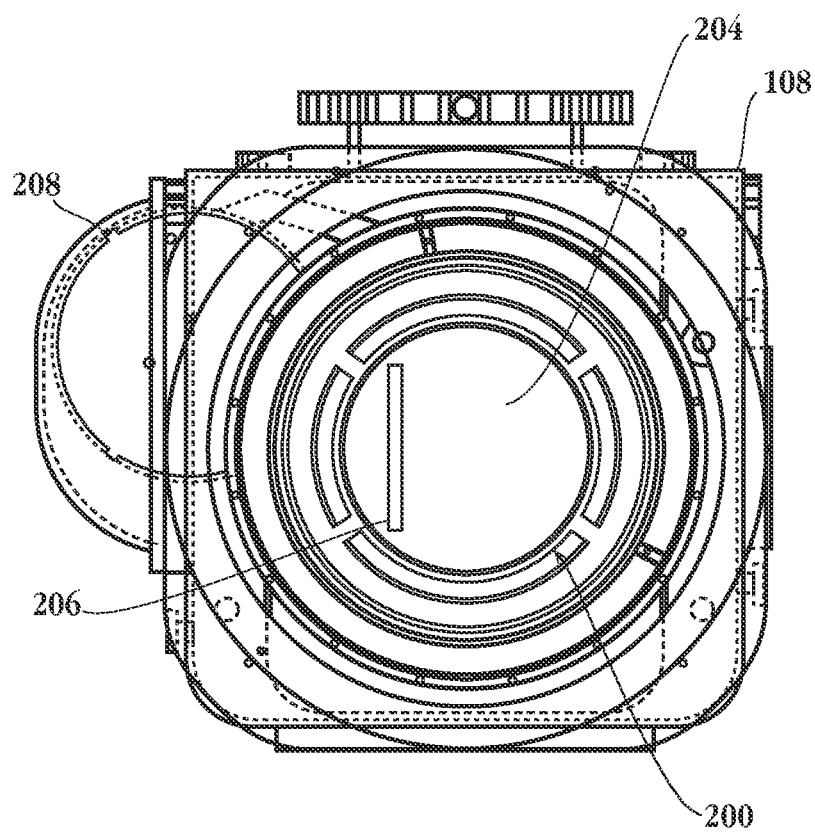
FIG. 2 is a simplified schematic diagram illustrating a top view of a HPC processing module in accordance with one embodiment of the invention.

FIG. 2 is a simplified schematic diagram illustrating a top view of a HPC processing module in accordance with one embodiment of the invention. Module 108 includes mask 204, which is placed over a substrate. Mask 204 has opening 206 defined therein and may be used for any of the deposition processes previously mentioned. It should be appreciated that a processing operation, e.g., a deposition operation, may be performed to deposit material onto a substrate surface exposed through opening 206. Chamber 108 includes shutter garage/pasting station 208. It should be noted that shutter garage/pasting station 208 is optional. Clamp ring 200 is configured such that a top surface of mask 204 will abut with a bottom surface of clamp ring 200. As will be explained in more detail below, the bottom surface of clamp ring 200 will also serve to center mask 204 and the substrate disposed under mask 204.

Figure 3:
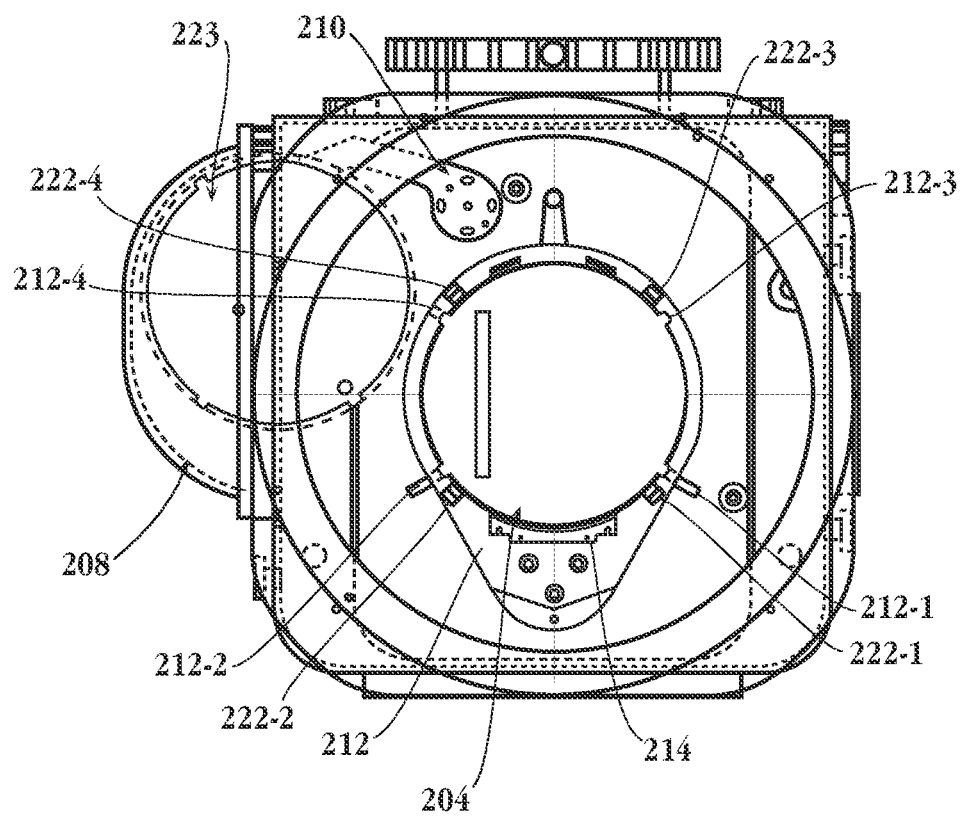
FIG. 3 is a simplified schematic diagram illustrating the lift hoop of the HPC deposition module in accordance with one embodiment of the invention.

FIG. 3 is a simplified schematic diagram illustrating the lift hoop of the HPC deposition module in accordance with one embodiment of the invention. The chamber top of HPC module 108 is not shown so that a top view of mask 204 and other components within the module can be seen. Tab extensions, emanating from the perimeter of mask 204 are resting on extensions 212-1 through 212-4, which extend from a base of lift hoop 212. Mask 204 is deposited into module 108 via robot 214. It should be appreciated that the extension arm for robot 214 is not illustrated in order to convey the details of lift hoop 212. Lift hoop 212 may be referred to as a support structure. Shutter garage 208 includes a robot blade 210 which may be used for transporting masks or pasting disks onto shadow mask 204. One skilled in the art will appreciate that the pasting disk allows depositions to occur without requiring a sacrificial wafer. A pasting disk, or sacrificial wafer, is generally used for burning in targets and/or reducing particulates within the chamber by depositing films which are less susceptible to flaking. As will be further illustrated, lift hoop 212 is capable of moving in a vertical direction in order to lift mask 204 or lower mask 204. In one embodiment, the movement of mask 204 is independent of a substrate or wafer to be processed in module 108. Initially, mask 204 is deposited onto extensions 212-1 through 212-4 when lift hoop 212 is in a lowered position. Tab extensions on shadow mask 204 contact lift extensions 212-1 through 212-4.

Figure 4A:
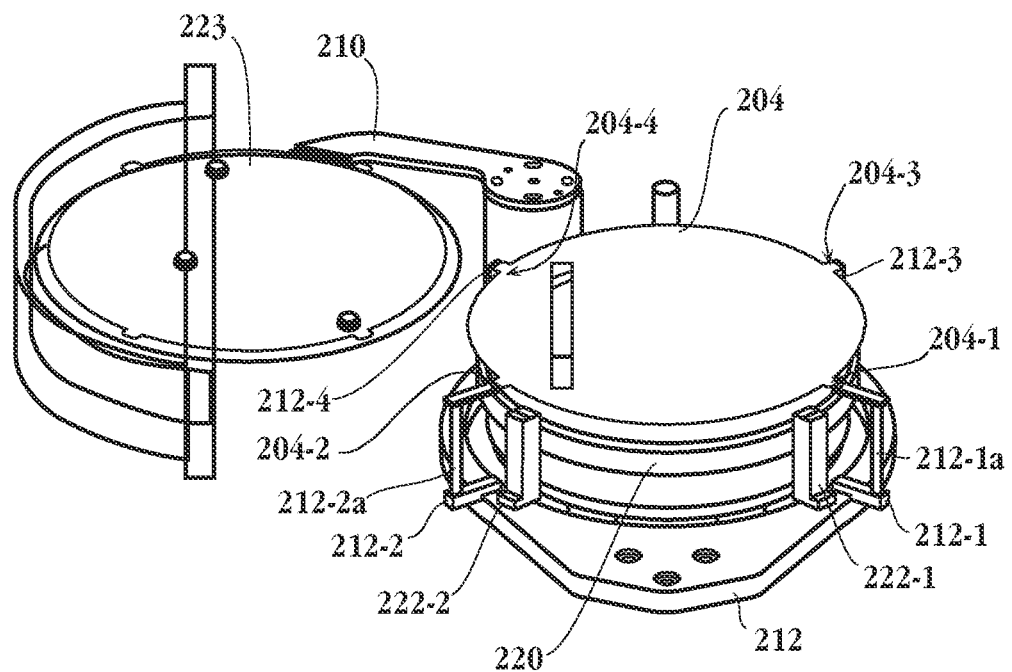
FIG. 4A is a simplified schematic diagram illustrating the lift hoop details for the HPC module in accordance with one embodiment of the invention.

FIG. 4A is a simplified schematic diagram illustrating the lift hoop details for the HPC module in accordance with one embodiment of the invention. Lift hoop 212 is an annular ring having arm extensions extending from a surface of a base of the lift hoop. In one embodiment, two sets of extensions are provided from lift hoop 212. Of course, more than two sets of extensions may extend from the base of the lift hoop. Arm extensions 212-1 through 212-4 make up one set of extensions, while arm extensions 222-1 through 222-4 make up another set of arm extensions. For ease of illustration for this view, arm extensions 222-1 and 222-2 are shown in FIG. 4A, while extensions 222-3 and 222-4 are hidden in the back side of lift hoop 212. Extensions 212-1 through 212-4 are configured to engage with extension tabs 204-1 through 204-4, respectively, in order to support mask 204. It should be appreciated that extensions 212-1 and 212-2 are configured so that a vertical support piece 212-1a and 212-2a extends outside a diameter of the annular lift hoop so that the shadow mask and substrate may be transported into the processing area.

Figure 4B:
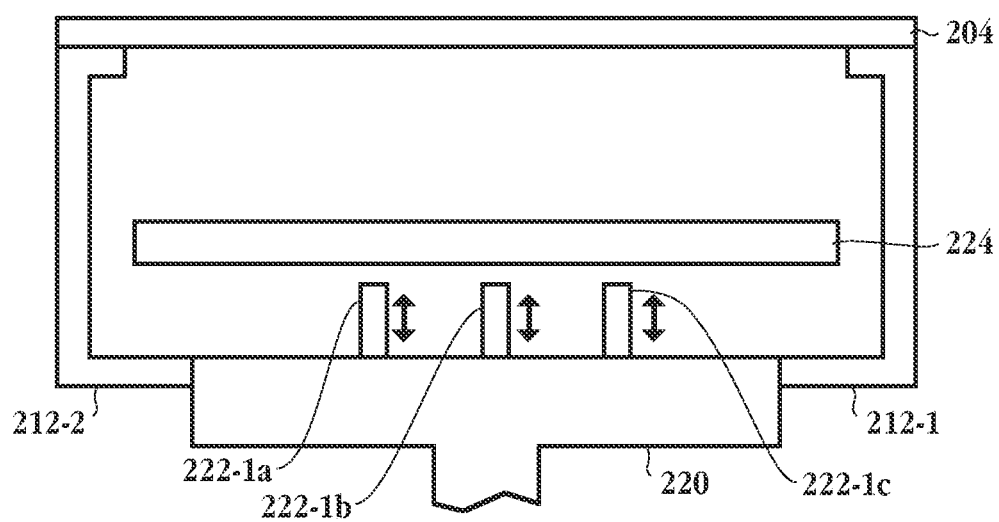
FIG. 4B is a simplified schematic diagram illustrating an alternative support mechanism to the embodiment of FIG. 4A.

Still referring to FIG. 4A, top and bottom horizontal extenders enable the vertical post to be extended outside of a diameter of lift hoop 212, i.e., the design may be referred to as cantilevered. Of course, as an alternative embodiment, the diameter of the lift hoop may be larger and arm extensions 222-1 through 222-4 may extend radially inward towards the center of the lift hoop. One skilled in the art will appreciate that numerous other configurations may be defined where the vertical posts are extended out to allow for a substrate to fit between them. For example, the vertical posts may be curved or bowed outward to accommodate the substrate movement. Pedestal 220 is disposed within an inner cavity defined by lift hoop 212. In one embodiment, pedestal 220 may include pins 222-1a through 222-1c that extend outward from a top surface of the pedestal to support substrate 224 instead of arm extensions 222-1 through 222-4, as illustrated in the cross section view of FIG. 4B. The pins may be moveable in a vertical direction so that the pins retract into the pedestal as well as rise above the pedestal. In this manner, the pins may be able to support substrate 224 independently of arm extensions 212-1 through 212-4. In yet another embodiment, extensions 212-1 through 212-4 may be affixed to pedestal 220 with the retractable pins located within an inner diameter of the top surface of the pedestal as illustrated in FIG. 4B. In this embodiment, lift hoop 212 would be not needed and extensions 212-1 through 212-4 may be electrically isolated from the pedestal through an insulator or non conductive material disposed between an end of the extensions attaching to the pedestal and the pedestal. In yet another embodiment, the extensions may be composed of a non-conductive material. Of course, pedestal 220 may utilize vacuum introduced through apertures defined on a top surface of the pedestal to support substrate 224 and the pins may be integrated into the embodiment where the lift hoop is used for the extensions to support the mask. It should be noted that pedestal 220 may include heating and cooling capability in another embodiment.

Robot blade 210 will function to transport pasting disk or additional masks 223 onto a top surface of mask 204. A drive for robot blade 210 will enable movement in an xy direction as well as rotational movement around an axis. One skilled in the art will appreciate that any conventional drive mechanism may be used to move lift hoop 212 in a vertical direction. In one embodiment, robot blade 210, also referred to as an end effecter, may be capable of moving in the z direction, i.e., vertical to the surface of the pedestal. It should be appreciated that in this embodiment, a single set of arm extensions will be sufficient to support mask 204 to enable the independent movement of the mask and substrate 224. In addition, pedestal 220 may be driven so that the pedestal may be moved vertically as well as have the ability to impart rotational movement for a substrate disposed thereon. It should be appreciated that pedestal 220 may provide heat and/or cooling to a substrate disposed thereon through known configurations. In one embodiment, a distance between mask 204 and substrate 224 when both are being supported on arm extensions of the support structure is about 0.5 inches, which correlates to a distance separating each wafer to be processed in a storage module, such as a FOUP. Of course, the embodiments may accommodate any desired separation between the mask and the wafer. In yet another embodiment, pedestal 220 may have vacuum capability to clamp substrate 224 to a top surface of the pedestal.

Figure 5:
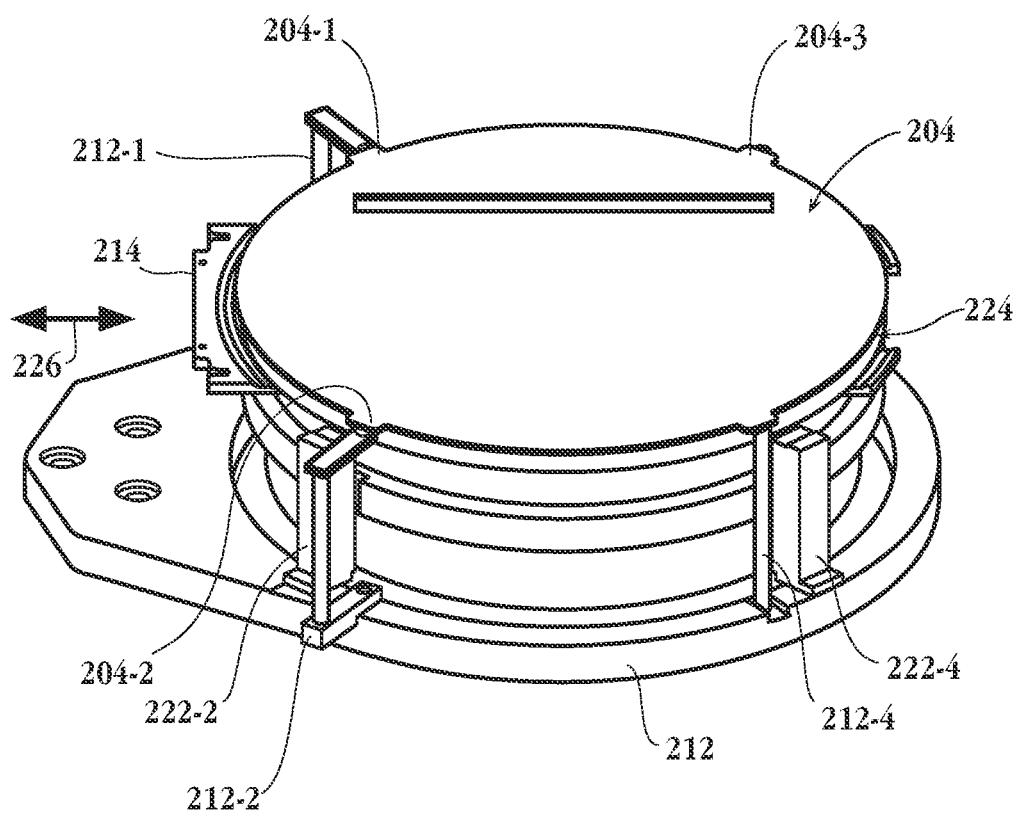
FIG. 5 is a simplified schematic diagram illustrating a side perspective view of the lift hoop having a mask disposed thereon in accordance with one embodiment of the invention.

FIG. 5 is a simplified schematic diagram illustrating a side perspective view of the lift hoop having a mask disposed thereon in accordance with one embodiment of the invention. Lift hoop 212 includes arm extensions 212-1 through 212-4, which support mask 204 through contact with tab extensions 204-1 through 204-4. Arm extensions 222-1 through 222-4 are configured to support substrate 224 thereon. Robot 214 transports substrate 224 into position through the opening defined between extension arms 212-1 and 212-2. That is, robot 214 transports substrate 224 through movement illustrated by arrow 226. As will be explained in more detail below, arm extensions 222-1 through 222-4 are configured to accept substrate 224 and in one embodiment, have a beveled edge or shoulder which serves to center substrate 224, as robot 214 lowers substrate 224 onto the top surface of arm extensions 222-1 through 222-4. Arm extensions 212-1 through 212-4 may have a protrusion which mates with an indentation defined on tab extensions 204-1 through 204-4, respectively, as will be illustrated in more detail below. It should be appreciated that in this embodiment the axes of each of the first set of extensions 222-1 through 222-4 define a circle that is concentric with the lift hoop.

Figure 6:
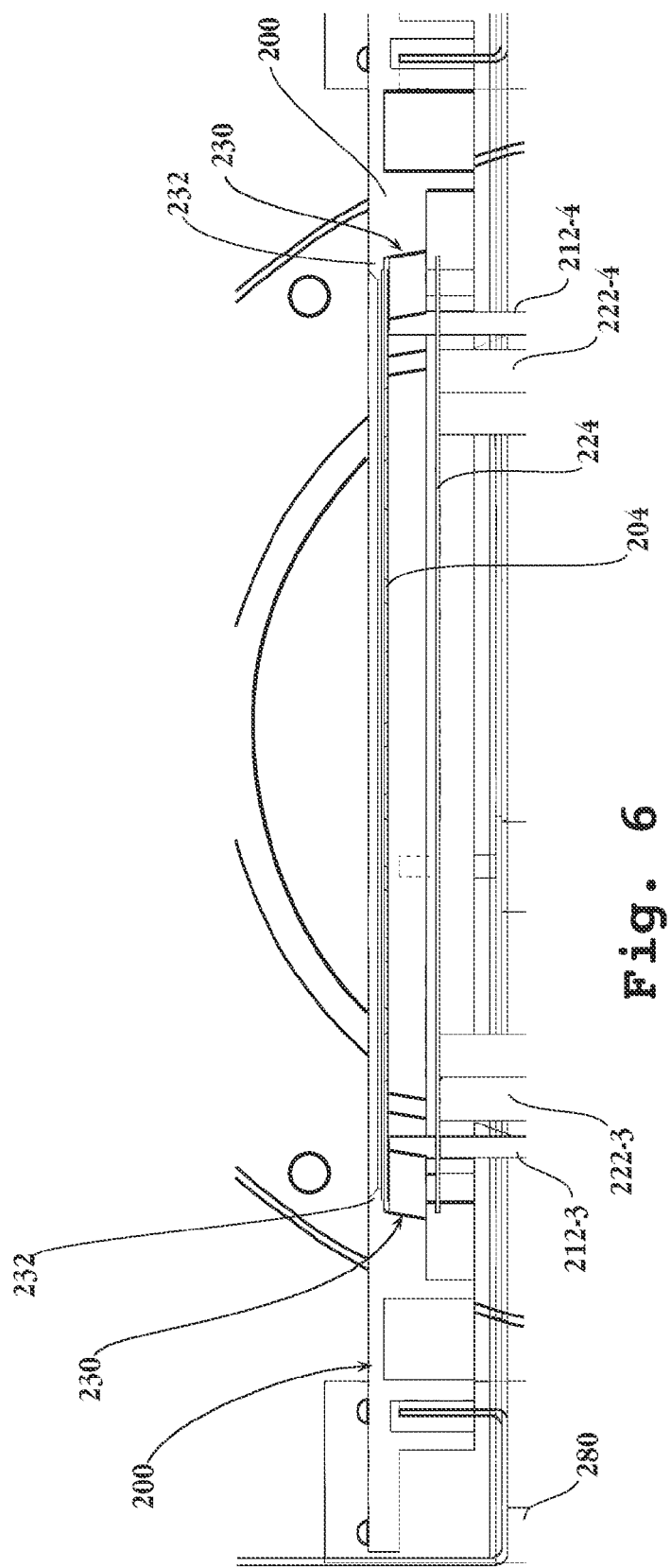
FIG. 6 is a simplified schematic diagram illustrating a cross-sectional view of the clamp ring and support structure for the mask and substrate in accordance with one embodiment of the invention.

FIG. 6 is a simplified schematic diagram illustrating a cross-sectional view of the clamp ring and support structure for the mask and substrate in accordance with one embodiment of the invention. Mask 204 is centered into a raised position as guided by beveled side wall 230 of clamp ring 200, while being raised. Beveled side wall 230 may be referred to as an angled shoulder that assists in centering the mask as the mask is lifted. Extensions 212-4 and 212-3 provide support for mask 204. Extensions 222-3 and 222-4 provide support for substrate 224. As the annular lift hoop is raised and vertically transports substrate 224 and mask 204, mask 204 eventually encounters beveled side wall 230 and surface 232 acts as a stop. Beveled sidewall 230 is angled inward, and consequently centers or positions mask 204 and substrate 224, thus acting as an alignment surface. Clamp ring 200 provides clearance to accommodate arm extensions 212-1 through 212-4 as illustrated further below. Shield 280 functions to confine the plasma gas to a plasma processing region within the processing chamber. In one embodiment, clamp ring 200 is electrically floating. However, clamp ring 200 may be tied to the potential of the pedestal in another embodiment.

Figure 7:
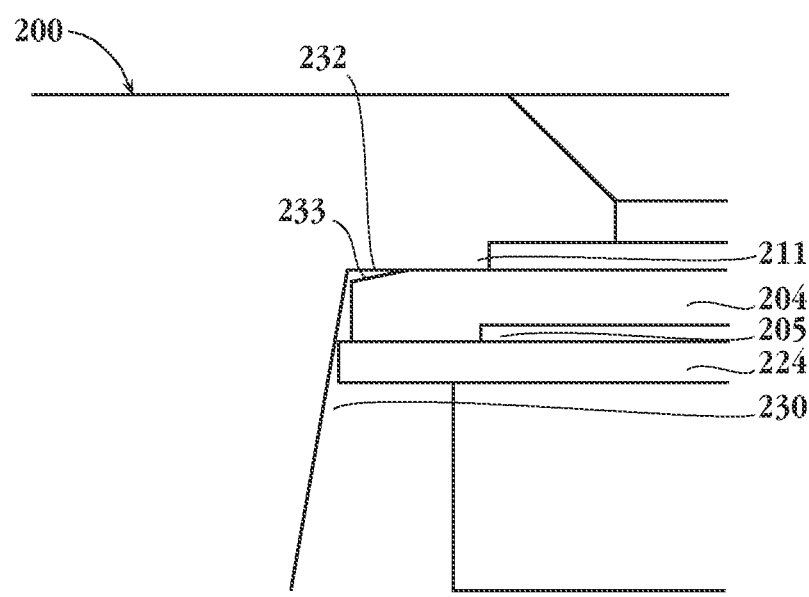
FIG. 7 is a simplified schematic diagram showing further details of the peripheral end of the substrate and the mask as both are raised against a surface of the clamp ring in accordance with one embodiment of the invention.

FIG. 7 is a simplified schematic diagram showing further details of the peripheral end of the substrate and the mask as both are raised against a surface of the clamp ring in accordance with one embodiment of the invention. Mask 204 is disposed over wafer 224 within an inner cavity defined by clamp ring 200. The lift hoop will lift mask 204 and wafer 224 against surface 232 of clamp ring 200. As illustrated and mentioned above, surface 230 is beveled or angled inward in order to guide or urge mask 204 and wafer 224 into a specified centered position within the processing region of the chamber. In one embodiment, the inward angle for surface 230 is about 10 degrees, however, this is only one exemplary embodiment and the angle may be any suitable angle that is less than or greater than 10 degrees from a vertical axis. In the embodiment of FIG. 7, it should be appreciated that mask 204 has an annular shoulder extending from a surface of the mask around a circumference of the mask in order to provide a slight degree of separation between mask 204 and wafer 224 within an inner circumferential region of the mask. The slight separation is illustrated in region 205 and the annular shoulder around the circumference of the mask is illustrated in section 207 of mask 204. In addition, mask 204 has a beveled edge at the outer perimeter, as illustrated by edge 203. In one embodiment, an angle of beveled edge 233 is about 10 degrees. Of course, this angle is exemplary as other angles greater or less than 10 degrees from a horizontal plane of the top surface of mask 204 may be employed. In one exemplary embodiment, the outer peripheral section illustrated by region 211 is about 10 millimeters in width, however, this dimension is not meant to be limiting.

Figure 8:
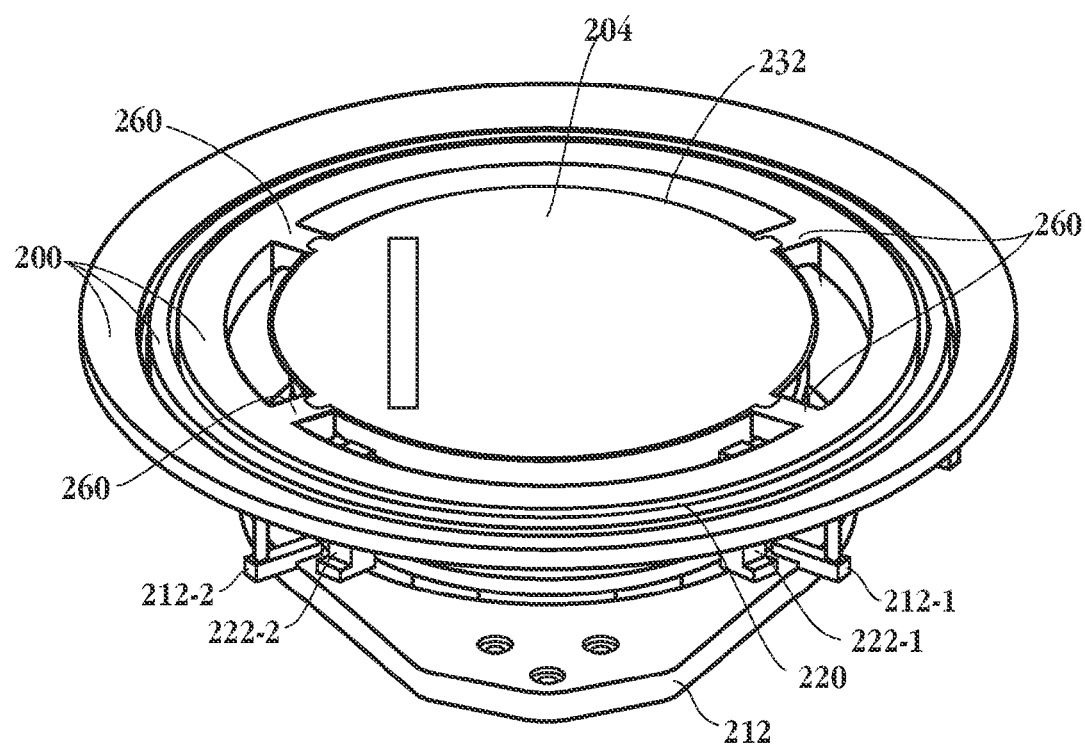
FIG. 8 is a simplified schematic diagram illustrating a top perspective cross-sectional view of a HPC module having a multi-level support structure for independent movement of a substrate and a mask in accordance with one embodiment of the invention.

FIG. 8 is a simplified schematic diagram illustrating a top perspective cross-sectional view of a HPC module having a multi-level support structure for independent movement of a substrate and a mask in accordance with one embodiment of the invention. It should be noted that in the view of FIG. 8 clamp ring 200 has been cross-sectioned so that the various features may be better illustrated. Mask 204 is disposed over a substrate in order for processing to take place through window 206. Clamp ring 200 is configured to provide indentations or recesses 260 in order for extension arms 212-1 through 212-4 to vertically rise and support the tab extensions of mask 204 in order to bring mask 204 against support surface 232 of the clamp ring. In one embodiment, lift hoop 212 is used to lift mask 204 against support surface 232 while surface 230 of FIG. 6 centers mask 204. Returning to FIG. 8, a substrate would be then brought up and into contact with mask 204 by pedestal 220. In an alternative embodiment, pedestal 220 may be used to lift a substrate from the support structure represented by lift hoop 212 and corresponding arm extensions, and continue rising until mask 204 is lifted off the second level of the support structure. The pedestal will continue rising until mask 204 contacts support surface 232 of clamp ring 200.

Figure 9:
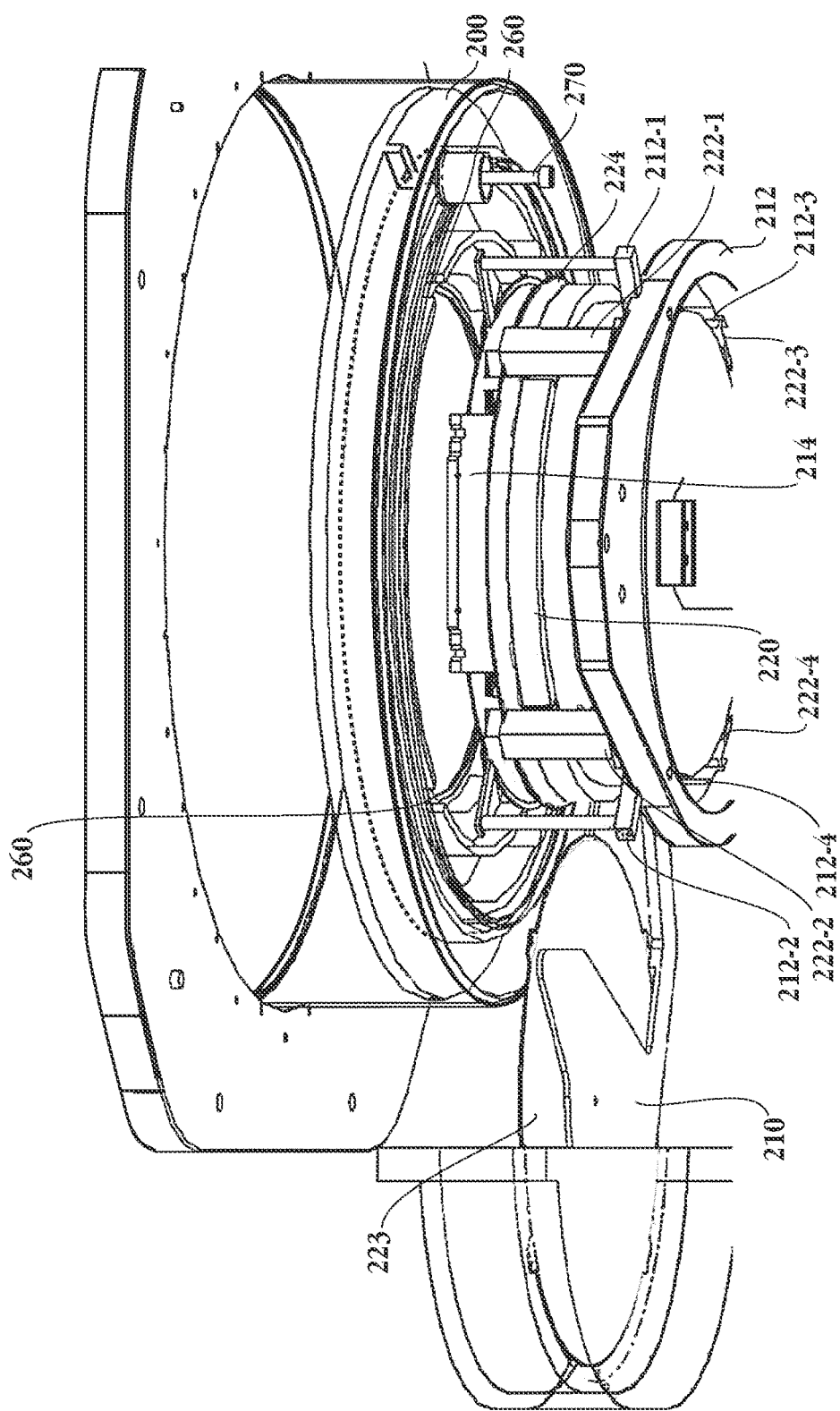
FIG. 9 is a bottom perspective view illustrating the support structure and clamp ring within a HPC module in accordance with one embodiment of the invention.

FIG. 9 is a bottom perspective view illustrating the support structure and clamp ring within a HPC module in accordance with one embodiment of the invention. Lift hoop 212 supports arm extensions 212-1 through 212-4 and a second set of arm extensions 222-1 through 222-4. Robot 214 will place mask 204 and substrate 224 onto their respective support structure levels on corresponding sets of arm extensions. Clamp ring 200 is disposed within the HPC processing module and mask 204, as well as substrate 224, are raised into position against a support surface so that processing may take place. In one embodiment, robot 214 may be used to place additional masks or pasting disks into the processing area of the chamber. Pasting disk 223 may be used with or without a substrate as one skilled in the art will appreciate. As mentioned previously, pedestal 220 may be used in conjunction with lift hoop 212 to vertically maneuver substrate 224 and mask 204. In one embodiment, pedestal 220 may have a heating element in order to heat substrate 224. One skilled in the art that various mechanisms to provide heat, such as resistive heating, may be employed within pedestal 220. In order to enable lift hoop 212 to raise and bring mask 204 into position within clamp ring 200, recesses 260 are defined within clamp ring 200 so that extension arms 212-1 through 212-4 may raise up and place mask 204 into position unimpeded. Extension 270, which is electrically tied into clamp ring 200, is used to ground clamp ring 200. Alternatively, clamp ring 200 may be tied to the potential of pedestal 220 by electrically connecting extension 270 to the pedestal in one embodiment of the invention.

Figure 10:
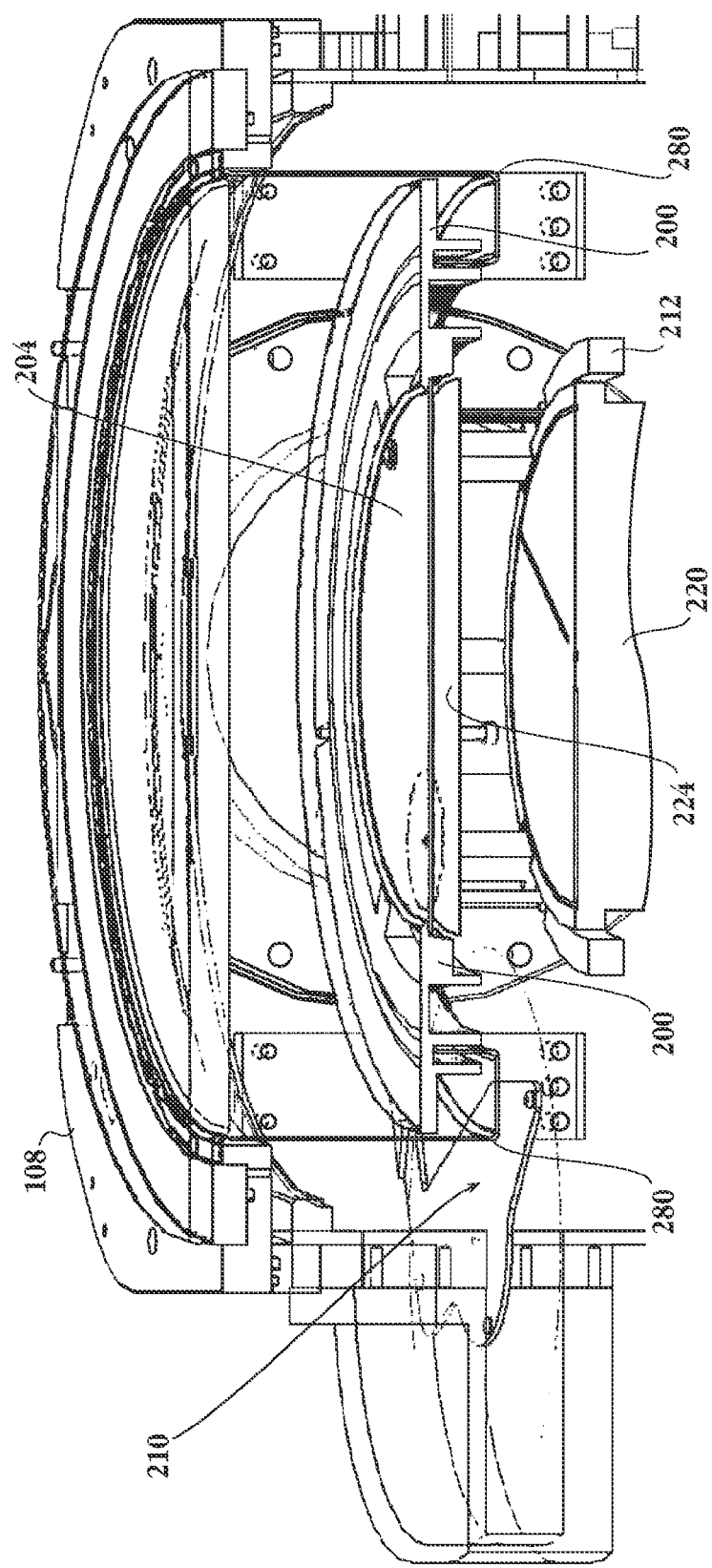
FIG. 10 is a simplified cross-sectional perspective view of the HPC processing module in accordance with one embodiment of the invention.

FIG. 10 is a simplified cross-sectional perspective view of the HPC processing module in accordance with one embodiment of the invention. Module 108 is illustrated with clamp ring 200 having a mask 204 disposed thereon. Substrate 224 and mask 204 are supported by the support structure represented by lift hoop 212, as described in the above figures. Module 108 includes shield 280 that functions to contain the plasma within a processing region of a HPC module 108. Pedestal 220 is used to lift substrate 224 from support structure and force the substrate against a bottom surface of mask 204, for processing to take place. One skilled in the art will appreciate that the ability to lift substrate 224 against mask 204 with pedestal 220 will provide the ability to bias the substrate through the pedestal in accordance with one embodiment of the invention.

Figure 11:
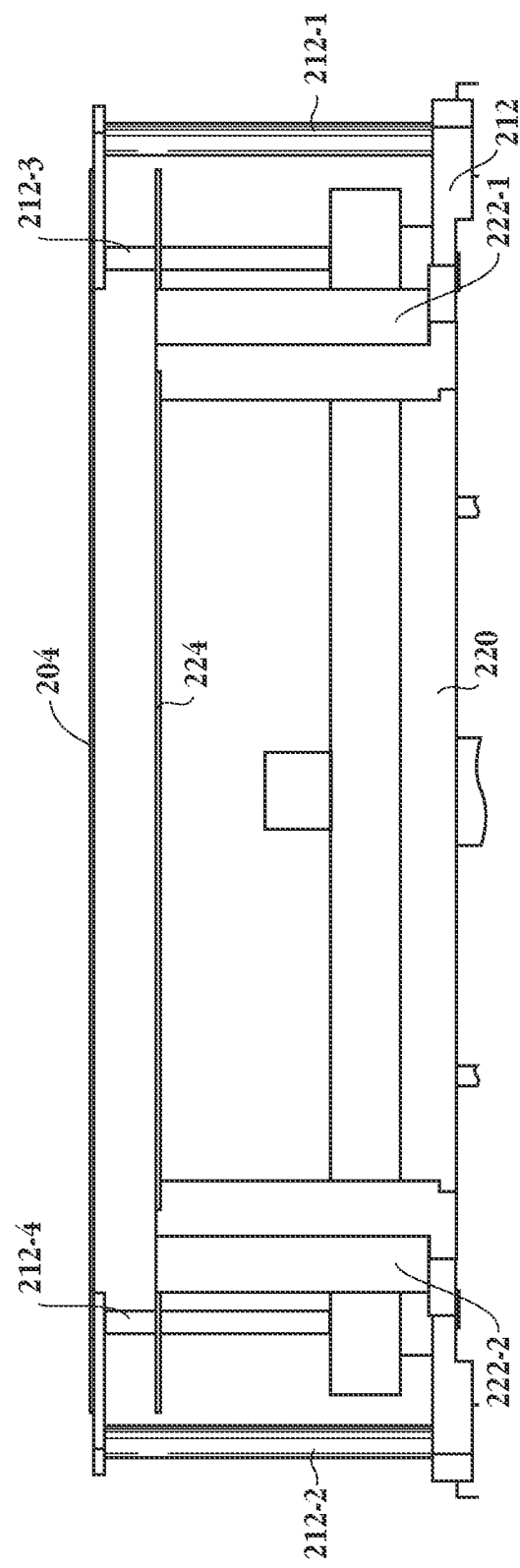
FIG. 11 is a simplified cross-sectional view of the support structure used to independently support a substrate and a mask in accordance with one embodiment of the invention.

FIG. 11 is a simplified cross-sectional view of the support structure used to independently support a substrate and a mask in accordance with one embodiment of the invention. The support structure includes two sets of extensions extending from a surface of lift hoop 212. The first set of extensions 212-1 through 212-4 is configured to support a mask 204. The second set of extensions 222-1 through 222-4 (222-3 and 222-4 are not shown in this illustration) is configured to support substrate 224. The first set of extensions 212-1 through 212-4 include two extensions 212-1 and 212-2 that extend outside a diameter of lift hoop 212 to enable a substrate to traverse therethrough. That is, the distance between the vertical posts of extensions 212-1 and 212-2 is greater than a diameter of substrate 224. The two extensions 212-1 and 212-2 are shown having a first horizontal extension from lift hoop 212 and another horizontal extension used to support mask 204 with a vertical post connecting the two horizontal extensions. The configuration for arm extensions 212-1 and 212-2 enables substrate 224 to pass through in order to be supported by the corresponding second set of extensions 222-1 through 222-4, wherein the corresponding lower horizontal extensions emanate from the base of lift hoop 212. As mentioned previously, the support of mask 204 is enhanced by bumps or protrusions defined on top of the horizontal extension at the top surface of each of extension arms 212-1 through 212-4. In one embodiment, the bump or protrusion will mate with a recess in an underside of corresponding tab extension of mask 204. In this manner, the radial and azimuthal configuration of mask 204 is more accurately controlled. Thus, the features described above allow for circumferential, repeatable placement of mask 204 relative to the wafer or substrate. In one embodiment, arm extensions 222-1 through 222-4, which may be referred to as a second set of extensions, enable substrate 224 to be supported within a chamfer defined on a top surface of each respective arm extension. Thus, when a robot places substrate 224 onto this second set of extensions, the wafer will become centered. In addition, this configuration allows for some tolerance in the transfer of the wafer from the robot. Pedestal 220 is configured to move in a vertical position so that contact can be made with substrate 224, which in turn can contact mask 204. It should be appreciated that multiple sets of extension arms may be defined on lift hoop 212. That is, multiple masks may be used for the processing of substrate 224 by further defining additional sets of extension arms. Furthermore, the decoupling of the movement of mask 204 and substrate 224 is enabled through the configuration of the independent support structures. In one embodiment, the mask may be rotated or replaced with another mask to enable the combinatorial processing of the substrate without breaking vacuum in the processing chamber. Further details on the combinatorial processing may be found in application Ser. Nos. 11/672,478, 11/672,473, 11/674,132, and 11/674,137.

Figure 12:
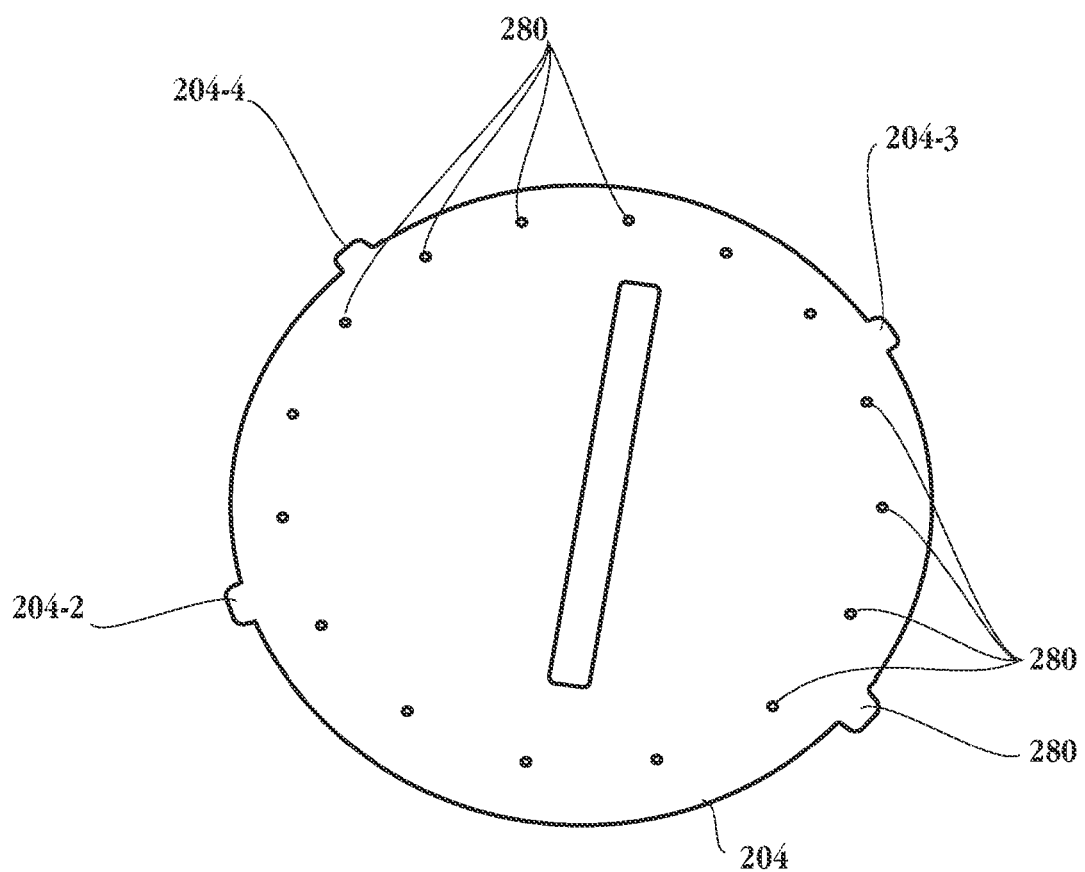
FIG. 12 is a simplified schematic diagram illustrating the mask in accordance with one embodiment of the invention.
Figure 13:
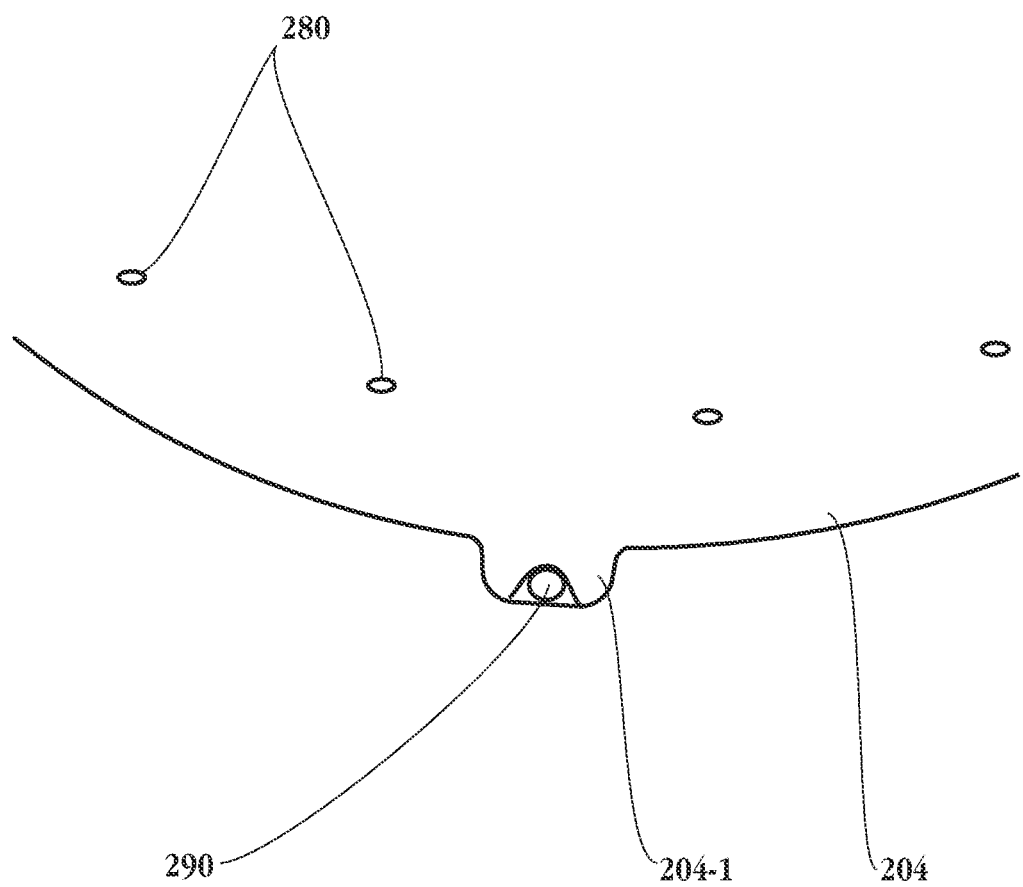
FIG. 13 is a simplified schematic diagram illustrating an underside of mask 204 in accordance with one embodiment of the invention.

FIG. 12 is a simplified schematic diagram illustrating the mask in accordance with one embodiment of the invention. Mask 204 includes tab extensions 204-1 through 204-4 which are distributed around the circumference of mask 204. In one embodiment, tab extensions 204-1 through 204-4 are distributed evenly around the circumference of the mask. Of course, tab extensions 204-1 through 204-4 may be distributed in any fashion that will support mask 204 and allow for placement of the arm extensions so that a substrate may pass through. Furthermore, while 4 tab extensions are illustrated, it should be noted that more or less tab extensions may be utilized, as long as sufficient tab extensions are available to support the mask. Opening 206 is defined within mask 204. It will be apparent to one skilled in the art that any desired shape for opening 206 may be used within mask 204, as required by the particular process or combinatorial process. For example, a pie-shaped wedge may be defined on mask 204 or different geometrical shapes may be defined as opening 206 within mask 204. Along the outer region of mask 204 are defined dimples 280. It should be appreciated that dimples 280 provide a level of separation from mask 204 and a substrate disposed thereunder. Again, one skilled in the art will appreciate that dimples 280 may be disposed in any pattern around mask 204 that will provide a degree of separation from mask 204 and a substrate disposed thereunder. For example, additional dimples 280 are defined along an edge of opening 206. Dimples 280 will have a corresponding protrusion emanating from the opposing surface of mask 204 as illustrated in FIG. 13. In one embodiment, the dimples may be avoided by placing bumps or protrusions on the opposing surface of the mask to provide the separation between the bottom surface of the mask and the top surface of the substrate. As will be apparent to one skilled in the art, the dimples, and corresponding protrusions, can be created by punching the top surface of the mask with an object to force the deformation of the mask at a point being impacted. Alternatively, a bump or extension can be directly affixed to the bottom surface of the mask. On skilled in the art will appreciate that the shape of the protrusions on the bottom surface may be any suitable shape that provides the necessary separation. For example, the bumps or extensions may be affixed by welding, reflowing, etc., onto the bottom surface of the mask. Furthermore, the embodiment depicted by FIG. 12 would eliminate the need for the shoulder around the periphery of the mask illustrated with reference to FIG. 7. The amount of separation provided by the embodiments of FIGS. 7 and 12 may be dependent on the film properties and accuracy required for the processing operation. Smaller separation heights allow for more accurate deposition film edges, i.e., less shadow effects. In one embodiment, an amount of separation between the mask and the substrate is about 0.001 inches. In another embodiment, the amount of separation between the mask and the substrate is about 0.01 inches.

FIG. 13 is a simplified schematic diagram illustrating an underside of mask 204 in accordance with one embodiment of the invention. Here, tab extension 204-1 includes a concave indentation 290 defined thereon. The concave indentation will mate with a protrusion on a corresponding arm extension associated with the lift hoop. This mating will allow the corresponding lift fingers or extension arms to accurately control azimuth and radial location of the mask. In addition, the bumps/protrusions 280 are illustrated on the underside of mask 204.

Figure 14:
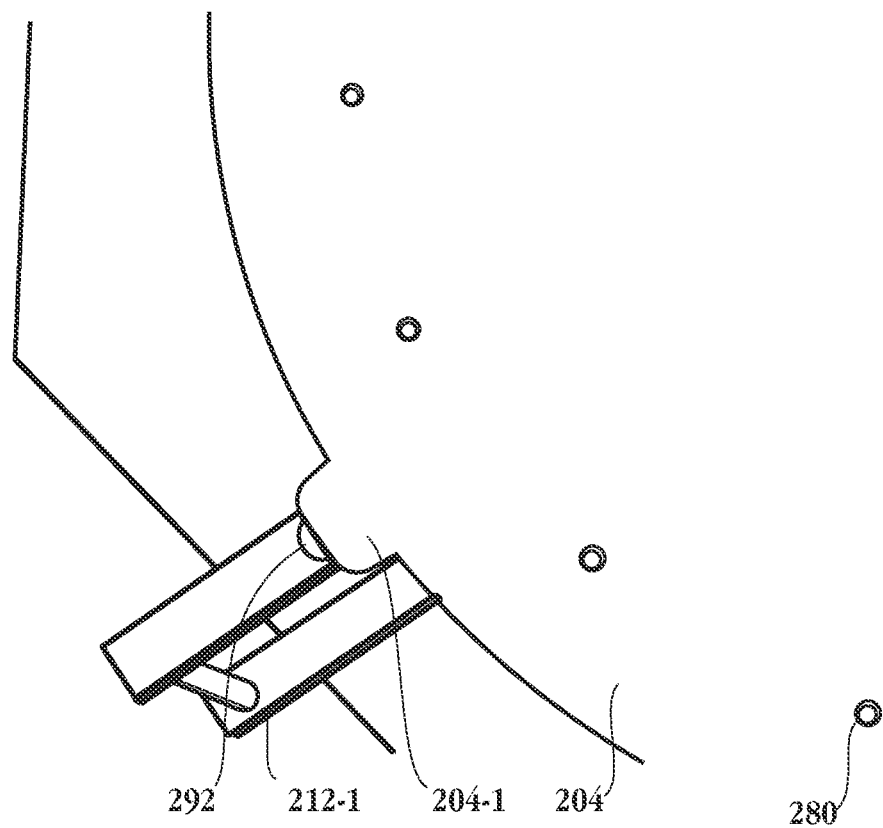
FIG. 14 is a simplified schematic diagram illustrating a top view of the mask resting on a support structure arm extension in accordance with one embodiment of the invention.

FIG. 14 is a simplified schematic diagram illustrating a top view of the mask resting on a support structure arm extension in accordance with one embodiment of the invention. Mask 204 is resting on arm extension 212-1 with tab extension 204-1 contacting a top surface of arm extension 212-1. Bump 292, on a top surface of the horizontal extension of arm extension 212-1, mates with the underside indentation of tab extension 204-1 that is illustrated in FIG. 13. Returning to FIG. 14, dimple 280 is illustrated which corresponds to the bumps discussed with regard to FIG. 13 on the underside of mask 204. It should be appreciated that arm extension 212-1 may be referred to as a cantilevered finger that provides support for mask 204.

Figure 15:
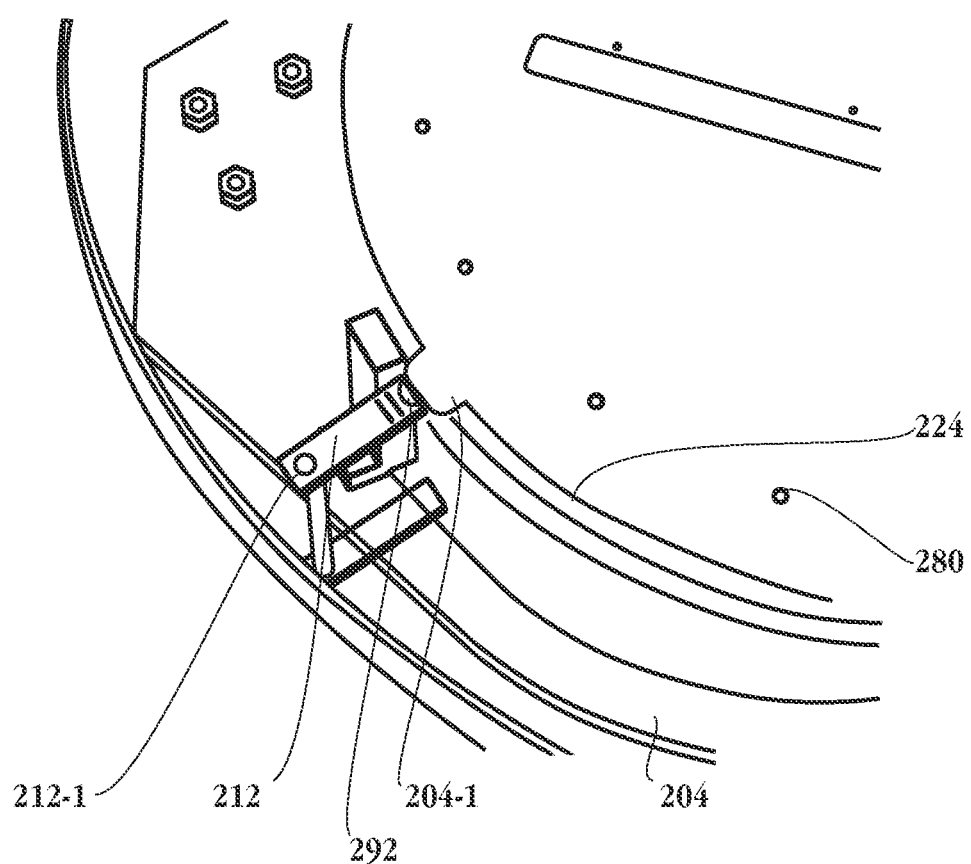
FIG. 15 is a simplified schematic diagram illustrating a more detailed view of the arm extensions for the two support structures in accordance with one embodiment of the invention.

FIG. 15 is a simplified schematic diagram illustrating a more detailed view of the arm extensions for the two support structures in accordance with one embodiment of the invention. Mask 204 is supported by arm extensions 212-1 and corresponding extensions 212-2 through 212-4 (not shown). Bump 292 will mate with a corresponding indentation on the underside of mask 204. Arm extension 212-1 is configured to enable the transport of substrate 224 into and out of the chamber independent of mask 204. Arm extension 222-1 is configured to support substrate 224. In one embodiment, a chamfer on a top surface of arm extension 222-1 holds substrate 224 and provide a centering function. As illustrated, arm extensions 222-1 and 212-1 are affixed to a base of lift hoop 212.

Figure 16:
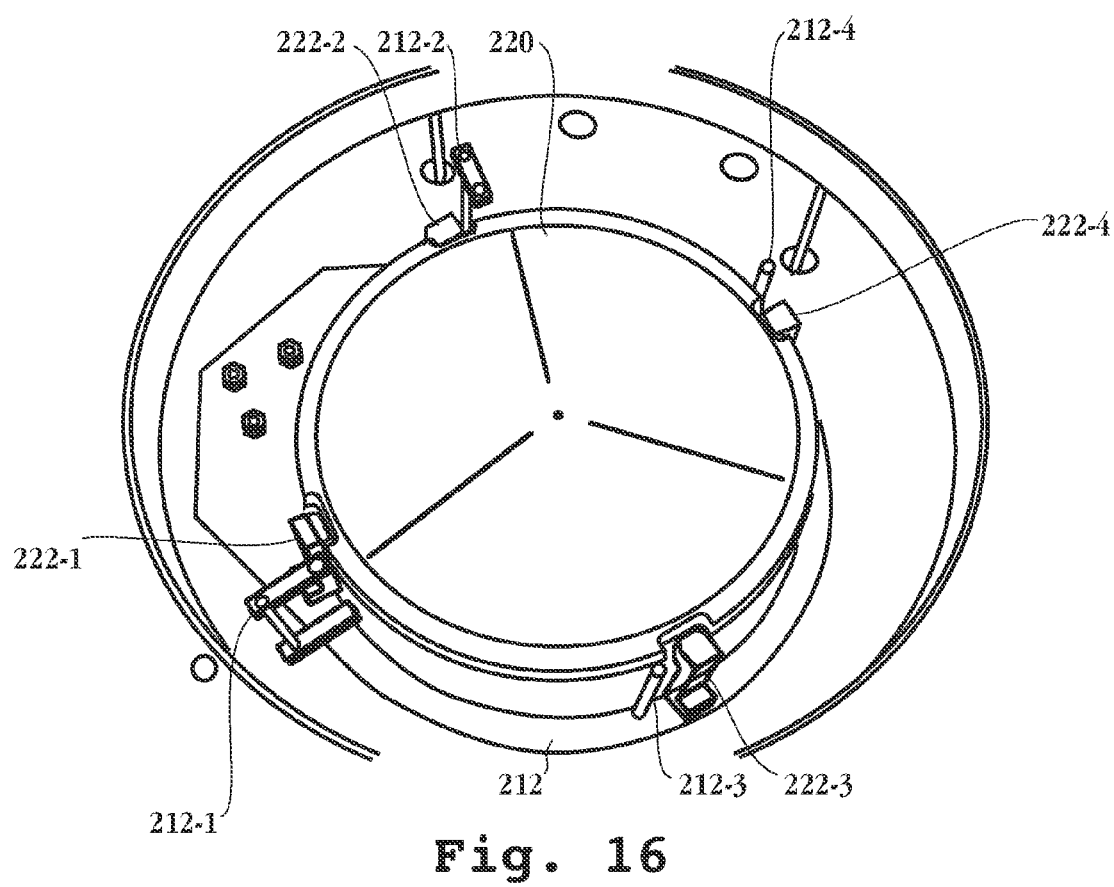
FIG. 16 is a simplified schematic diagram illustrating a top view of a support structure and pedestal in accordance with one embodiment of the invention.

FIG. 16 is a simplified schematic diagram illustrating a top view of a support structure and pedestal in accordance with one embodiment of the invention. Lift hoop 212 is disposed within the chamber and pedestal 220 is defined within a cavity defined by lift hoop 212. The multi-level support structure of lift hoop 212 has a first set of extensions 212-1 through 212-4. A second set of extensions 222-1 through 222-4 are also included. The first set of extensions 212-1 through 212-4 includes two varieties of extensions, i.e., 212-1 and 212-2, and a second variety of extensions 212-3 and 212-4. The first variety of extensions 212-1 and 212-2 include corresponding horizontal extensions with one horizontal extension extending from lift hoop 212 and another horizontal extension extending from a vertical post connecting the two horizontal extensions. This configuration enables the distance between the vertical posts for extension 212-1 and 212-2 to be widened in order for a substrate to be passed through that distance. The second variety of extensions 212-3 and 212-4 include a post having a top surface that will mate with an underside of a tab extension of a mask disposed thereon. Since the substrate does not pass through the distance defined between post 212-3 and 212-4 the configuration may be a simple extension from the lift hoop 212. The second set of extensions 222-1 through 222-4 are similar in nature and may be equally disposed around lift hoop 212 in one embodiment. Of course, the extensions may be disposed in any manner around the base of the lift hoop as long as the extensions provide the necessary support. A top surface of posts 222-1 through 222-4 may have a bi-level surface where a chamfer encourages or guides a substrate into position within the circumference defined by posts 222-1 through 222-4 as further described below.

Figure 17:
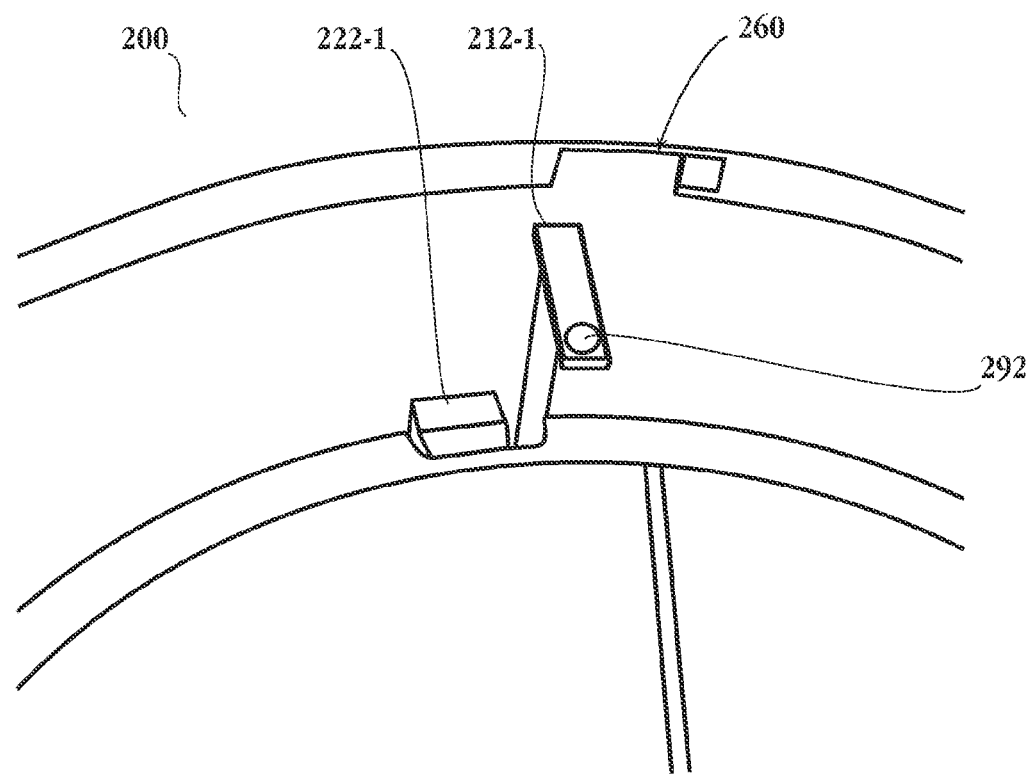
FIG. 17 is a simplified schematic diagram illustrating a more detailed view of a top of the support extensions in accordance with one embodiment of the invention.

FIG. 17 is a simplified schematic diagram illustrating a more detailed view of a top of the support extensions in accordance with one embodiment of the invention. Support extension 212-1 includes a bump 290 which will mate with a corresponding indentation on a mask. Support arm 222-1 has a top surface which has a bi-level surface with a chamfer connecting the two surfaces so that a substrate will rest within or on the lower surface against the chamfer. Thus, a substrate delivered from a robot will rest against the lower surface of the bi-level surface of support arm 222-1 while an edge of the substrate is positioned against the chamfered surface for centering purposes. In one embodiment, the difference in height between the two surfaces of the bi-level surface is about the thickness of a substrate. In this embodiment, the difference in height is about 0.29 inches. Clamp ring 200 includes a clearance slot 260 so that arm extension 212-1 may rise into the clearance slot in order to raise a mask disposed thereon against a bottom stop surface of clamp ring 200.

Figure 18A:
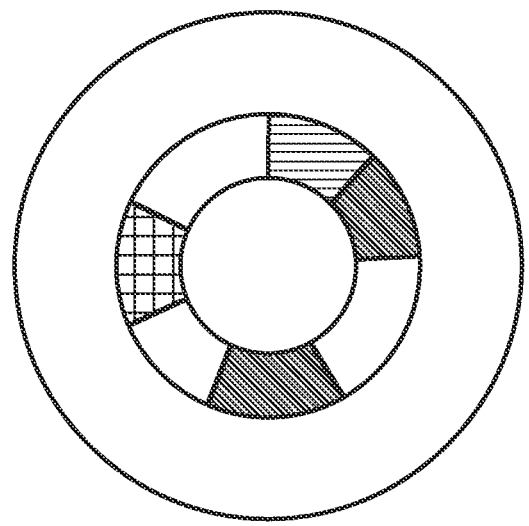
FIGS. 18A and 18B are simplified schematic diagrams illustrating a substrate having multiple depositions and a mask that is rotated through an orienter to enables the multiple depositions in accordance with one embodiment of the invention.
Figure 18B:
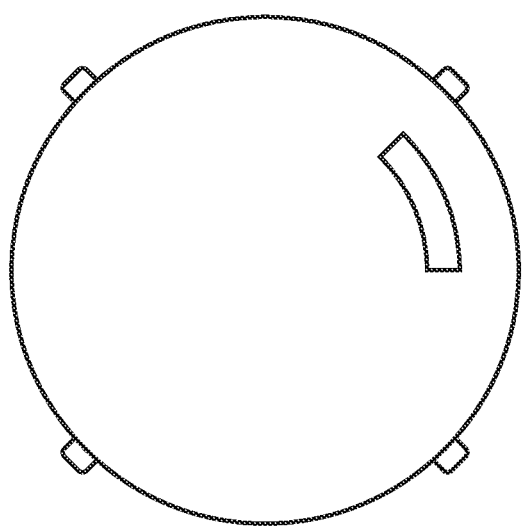

FIGS. 18A and 18B are simplified schematic diagrams illustrating a substrate having multiple depositions and a mask that is rotated through an orienter to enables the multiple depositions in accordance with one embodiment of the invention. In FIG. 18A, substrate 350 has areas with multiple deposition areas 350-1 through 350-5 defined thereon. The pattern and shape for the multiple depositions are provided through the rotation of mask 352. In one embodiment, an orienter, such as modules 116 and 118 of FIG. 1, may be used to rotate mask 352 so that multiple deposition areas 350-1 through 350-5 can be defined with a single mask. That is, mask 352 is moved out of the combinatorial processing module after each deposition and into an orienter to rotate or orient the mask so that successive deposition areas 350-1 through 350-5 are created. The orienter may use a notch on the mask as a reference point in one embodiment. Alternatively, the mask may be removed from contact with the substrate or removed from the chamber and the substrate may be rotated. It should be appreciated that the support structure described above enables the independent movement of the mask and the substrate. This capability, coupled with the ability to move a substrate in and out of the combinatorial chamber without breaking vacuum, enables the orienter to rotate the mask for performing depositions over certain regions of a substrate. It should be noted that while a pie-like shape window is defined on mask 352 of FIG. 18B, this is not meant to be limiting as any geometric shape may be incorporated into the embodiments described herein to perform a deposition over a region of substrate 350.

Figure 18C:
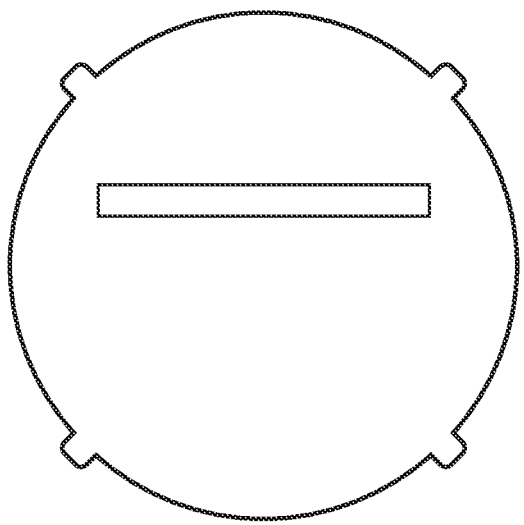
FIGS. 18C and 18D are simplified schematic diagrams illustrating a alternative substrate and mask combination to the combination of FIGS. 18A and 18B having multiple depositions where the mask is rotated through an orienter to enable the multiple depositions in accordance with one embodiment of the invention.
Figure 18D:
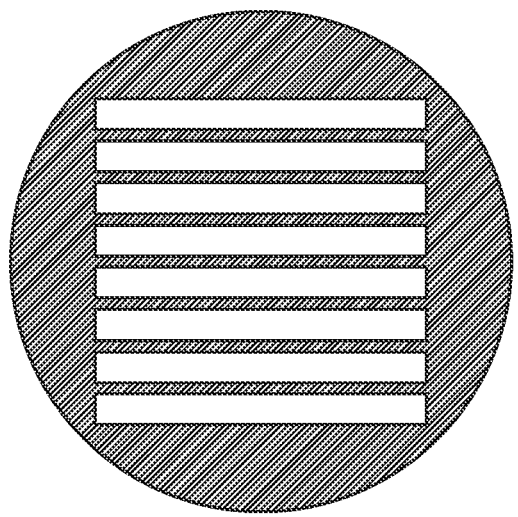

FIGS. 18C and 18D are simplified schematic diagrams illustrating a alternative substrate and mask combination to the combination of FIGS. 18A and 18B having multiple depositions where the mask is rotated through an orienter to enable the multiple depositions in accordance with one embodiment of the invention. Here, the mask of FIG. 18C would be one of five masks that would each be rotated 180 degrees through either an orienter or a robot to provide the pattern on the substrate of FIG. 18D. It should be noted that since each of the five masks is used twice, i.e., a first image and then a mirror image after the 180 degree rotation, ten patterns are defined on the substrate of FIG. 18D.

Figure 19:
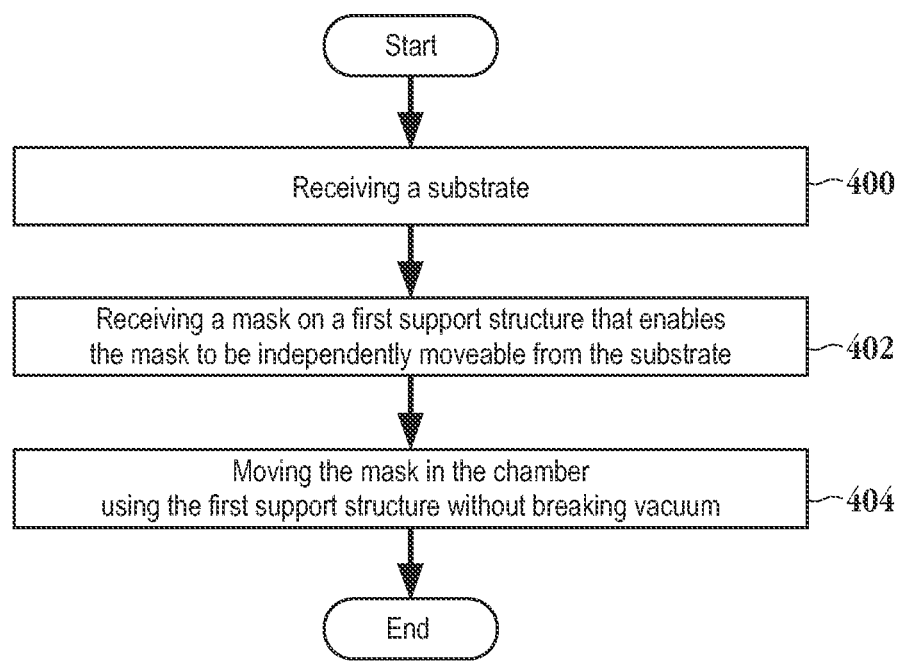
FIG. 19 is a flow chart diagram illustrating a method for processing a substrate in accordance with one embodiment of the invention.

FIG. 19 is a flow chart diagram illustrating a method for processing a substrate in accordance with one embodiment of the invention. The method initiates with operation 400 where a substrate is received into a processing chamber. Of course, the substrate may be received into a HPC chamber as described above. The method then advances to operation 402 where a mask is received in the processing chamber on a first support structure that is movable and independent from the substrate. In one embodiment, the mask is received on the support extensions 212-1 through 212-4 as described with reference to FIGS. 1 through 18. The mask may be mated with the support structure in order to enhance the azimuthal and radial distribution. The method then advances to operation 404 where the mask is moved within the processing chamber using the first support structure without breaking vacuum in the chamber. It should be appreciated that the mask may be moved out of the chamber and returned to the chamber after being rotated in an orienter or by a robot. Of course, the mask may be replaced by another mask also. In one embodiment, a second support structure may be included for receiving the substrate. A second support structure enables independent movement of the wafer. It should be appreciated that multiple support structures may be included on the support ring in accordance with one embodiment of the invention.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A combinatorial processing system, comprising:
 a structure for independently supporting a substrate and a mask in a processing chamber, the structure comprising:
 a first set of extensions for supporting the substrate;
 a second set of extensions supporting the mask;
 wherein the first and second sets of extensions enable independent movement of the substrate and the mask;
 wherein the second set of extensions enable the mask to be rotated and re-positioned within the processing chamber; and
 an orienter module having an orienter therein, the orienter operable to rotate the mask such that a plurality of deposition areas can be defined with the mask.

2. The combinatorial processing system of claim 1, wherein the mask is moved in the orienter module to rotate or orient the mask to create successive deposition areas after each deposition on the substrate.

3. The combinatorial processing system of claim 1, wherein the orienter uses a notch on the mask as a reference point before rotating or orienting the mask.

4. The combinatorial processing system of claim 1, wherein the mask includes a pie-like shaped window therein.

5. The combinatorial processing system of claim 1, wherein the mask can enter the orienter module from the processing chamber without breaking vacuum.

6. The combinatorial processing system of claim 1, wherein the second set of extensions include four tab extensions.

7. The combinatorial processing system of claim 1, wherein the mask includes a plurality of dimples operable to provide separation from the mask and the substrate.

8. The combinatorial processing system of claim 7, wherein each dimple has a corresponding protrusion emanating from an opposing surface of the mask.

9. The combinatorial processing system of claim 1, wherein the mask includes a bump affixed to a bottom surface of the mask to provide separation from the mask and the substrate.

10. The combinatorial processing system of claim 1, wherein the processing chamber is a module within a high productivity combinatorial (HPC) deposition system.

* * * * *